(12) United States Patent
Mai et al.

(10) Patent No.: US 11,552,645 B2
(45) Date of Patent: Jan. 10, 2023

(54) APPARATUS FOR MITIGATING WANDERING SPURS IN A FRACTIONAL-N FREQUENCY SYNTHESIZER

(71) Applicant: UNIVERSITY COLLEGE DUBLIN, Dublin (IE)

(72) Inventors: Dawei Mai, Wuhan (CN); Michael Peter Kennedy, Dublin (IE)

(73) Assignee: University College Dublin, Dublin (IE)

( * ) Notice: Subject to any disclaimer, the term of this patent is extended or adjusted under 35 U.S.C. 154(b) by 0 days.

(21) Appl. No.: 17/349,770

(22) Filed: Jun. 16, 2021

(65) Prior Publication Data
US 2021/0399734 A1    Dec. 23, 2021

Related U.S. Application Data

(60) Provisional application No. 63/040,362, filed on Jun. 17, 2020.

(51) Int. Cl.
  *H03L 7/197*   (2006.01)
  *H03M 3/00*    (2006.01)

(52) U.S. Cl.
  CPC .......... *H03L 7/1976* (2013.01); *H03M 3/404* (2013.01); *H03M 3/436* (2013.01); *H03M 3/438* (2013.01); *H03L 2207/05* (2013.01)

(58) Field of Classification Search
  CPC ...... H03M 4/404; H03M 4/414; H03M 4/436; H03M 4/438
  See application file for complete search history.

(56) References Cited

U.S. PATENT DOCUMENTS

| | | | | |
|---|---|---|---|---|
| 7,271,666 B1* | 9/2007 | Melanson | ............. | H03L 7/1976 |
| | | | | 455/260 |
| 8,169,351 B2* | 5/2012 | Lee | ........ | H03M 3/356 |
| | | | | 341/143 |
| 9,397,675 B1* | 7/2016 | Goodson | ................. | H03M 3/50 |
| 10,396,808 B2* | 8/2019 | Sun | .......................... | H03L 7/091 |
| 10,840,940 B2* | 11/2020 | Yin | ........................ | H03M 3/448 |
| 10,965,309 B1* | 3/2021 | Gunn | .................... | H03M 3/396 |
| 2009/0079605 A1* | 3/2009 | Chang | ................... | H03L 7/1976 |
| | | | | 327/105 |
| 2011/0095924 A1* | 4/2011 | Lee | ........................ | H03M 3/356 |
| | | | | 341/143 |
| 2014/0097875 A1* | 4/2014 | Tertinek | .................. | H03L 7/085 |
| | | | | 327/105 |
| 2019/0068207 A1* | 2/2019 | Mo | ...................... | H03M 7/3022 |
| 2019/0089368 A1* | 3/2019 | Mo | ....................... | H03M 3/394 |
| 2020/0204193 A1* | 6/2020 | Yin | ....................... | H03M 3/368 |

* cited by examiner

*Primary Examiner* — Lam T Mai
(74) *Attorney, Agent, or Firm* — Loza & Loza, LLP; Anthony Smyth (57) ABSTRACT

The present invention provides a fractional-N frequency synthesizer comprising a divider controller comprising a multistage noise Shaping (MASH) digital delta-sigma modulator comprising L error feedback modulator (EFM) stages, wherein the jth EFM stage is configured to receive as an input the sum of the error of the preceding EFM stage and a high amplitude dither signal derived from the error of the kth EFM stage, where $1 \leq j \leq k \leq L$.

20 Claims, 9 Drawing Sheets

APPARATUS FOR MITIGATING WANDERING SPURS IN A FRACTIONAL-N FREQUENCY SYNTHESIZER

CROSS-REFERENCE TO RELATED APPLICATIONS

This application claims priority to and the benefit of provisional patent application No. 63/040,362 filed in the United States Patent Office on Jun. 17, 2020, the entire content of which is incorporated herein by reference as if fully set forth below in its entirety and for all applicable purposes.

FIELD OF THE DISCLOSURE

This disclosure relates to fractional-N frequency synthesizers. More particularly, this disclosure relates to mitigating wandering spurs in such synthesizers.

DESCRIPTION OF RELATED ART

Figure 1:
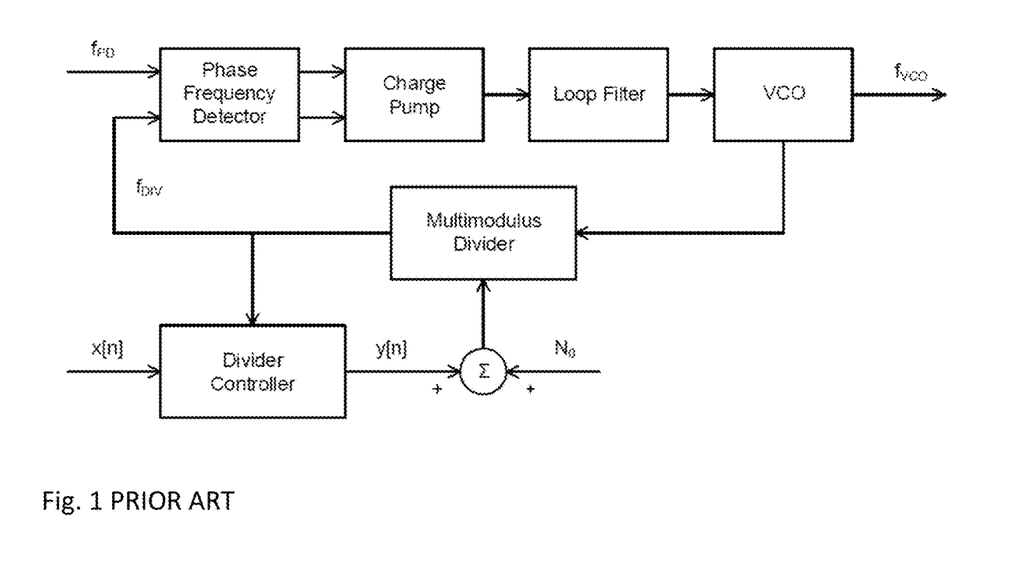
FIG. 1 shows a block diagram of a conventional fractional-N frequency synthesizer.

Fractional-N frequency synthesizers have been widely used to generate programmable carrier frequencies for several decades. FIG. 1 shows a block diagram of one conventional fractional-N frequency synthesizer. A phase frequency detector (PFD) receives a reference frequency $f_{PD}$. The output signals from the phase frequency detector are passed through a charge pump (CP) and onto a loop filter. The output of the loop filter is then fed to a voltage controlled oscillator (VCO). The output frequency of the voltage controlled oscillator, $f_{VCO}$, is fed to a multimodulus divider, which counts an integer number of cycles of the output frequency and generates the divided frequency $f_{DIV}$ as an input to the phase frequency detector, thus forming the synthesizer's phase-locked loop. A divider controller provides as an output the control signal y[n], to which a constant No is added. This sum is applied to the input of the multi modulus divider to control the instantaneous divide ratio. The output frequency $f_{VCO}$ is related to the reference frequency $f_{PD}$ by an integer No plus a rational fraction (x/M), where M is called the modulus and x is the input signal to the divider controller.

Figure 2:
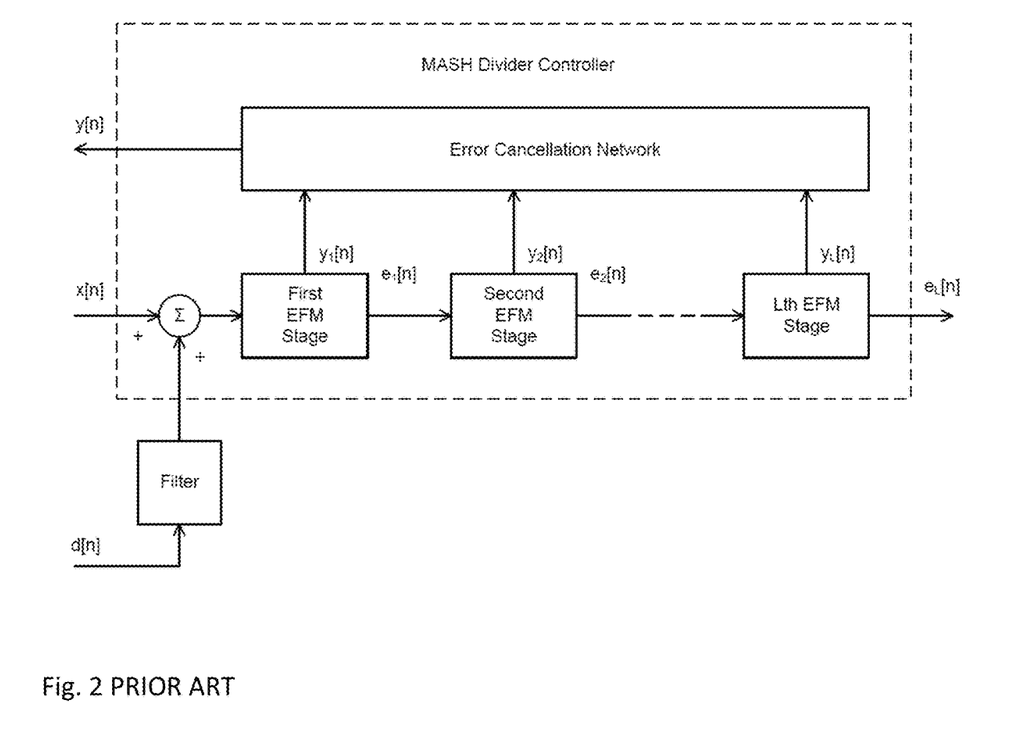
FIG. 2 shows a block diagram of a conventional divider controller based on a Multi stAge noise SHaping (MASH) digital delta-sigma modulator with shaped additive dither.
Figure 3:
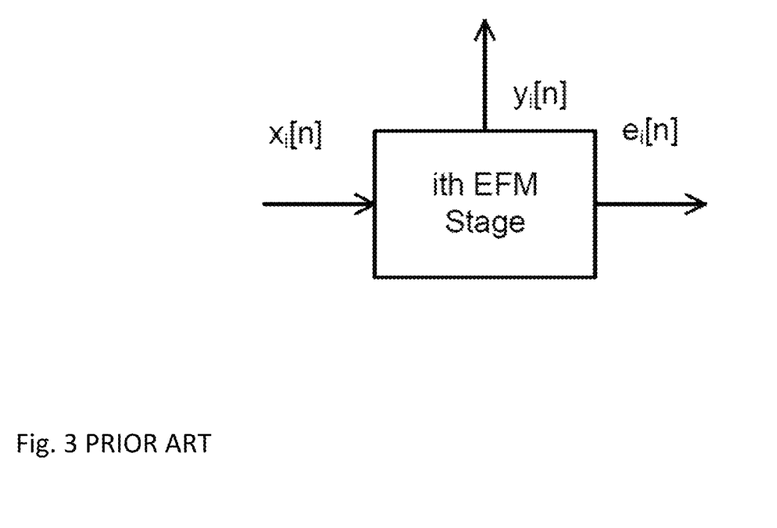
FIG. 3 shows a block diagram of a conventional Error Feedback Modulator (EFM)

One divider controller commonly used in a frequency synthesizer is a Digital Delta-Sigma Modulator (DDSM). FIG. 2 shows a block diagram of a DDSM comprising a MultistAge noise SHaping (MASH) digital delta-sigma modulator. This MASH digital delta-sigma modulator comprises a cascade of L number error feedback modulator (EFM) stages (denoted First EFM stage, Second EFM stage, . . . , Lth EFM Stage in FIG. 2). Each ith EFM stage has an input $x_i$, a first output $y_i$ and a second output $e_i$, which is called the error, as shown in FIG. 3. The first outputs $y_1$ to $y_L$ of the L error feedback modulator stages in FIG. 2 are combined in an error cancellation network. In the case of all but the last EFM stage, the second output $e_i$ is passed to the next error feedback modulator stage in the cascade.

The frequency spectrum of the output of a fractional-N frequency synthesizer is characterized by phase noise and spurious tones (spurs). In addition to the so-called reference spur, which is due to the periodic update of the synthesizer at the reference frequency $f_{PD}$, the frequency spectrum contains so-called fractional spurs. These fractional spurs have their origins in the divider controller signal y which is injected into the phase-locked loop. One known technique for breaking the periodicity of the output of the divider controller is to introduce an additive random or pseudorandom dither signal d at the input of the DDSM. The dither signal can be spectrally masked at the output of the DDSM by shaping it using a filter having a transfer function V(z), as is illustrated in FIG. 2.

Figure 4:
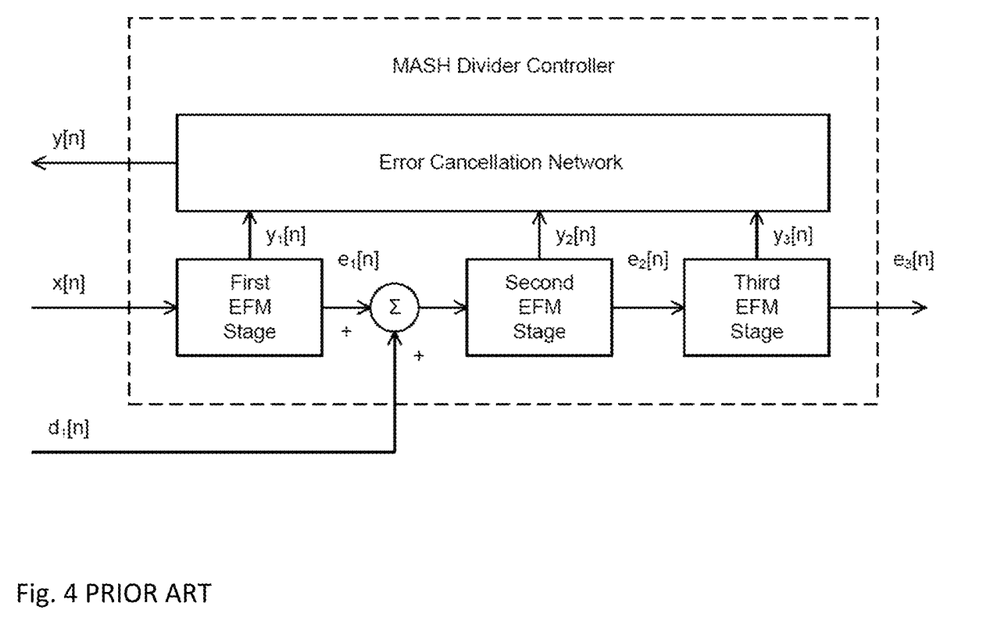
FIG. 4 shows a block diagram of a conventional additive LSB-dithered MASH 1-1-1 divider controller with first-order shaped additive dither.

A typical third-order MASH 1-1-1 digital delta-sigma modulator with first-order shaped dither is illustrated in FIG. 4. The cascade comprises three first-order error feedback modulators (denoted First EFM stage, Second EFM Stage, and Third EFM Stage) and an error cancellation network. A pseudorandom binary dither signal $d_1$ is added to $e_1$ and the sum is applied as input to the second EFM stage. In the z domain, $$Y(z)=(1/M)*[X(z)+(1-z^{-1})D_1(z)-(1-z^{-1})^3 E_3(z)],$$

where Y, X, $D_1$ and $E_3$ are the Z-transforms of y, x, the dither signal $d_1$, and the error $e_3$ of the third EFM stage in FIG. 4.

In the past, synthesizers operated at lower resolution (that is at smaller values of modulus M). At such a resolution, the synthesizer operated without any significant issues. However, one problem has become apparent as higher resolution fractional-N frequency synthesizers have become more frequently used, such as for example with a 20-bit fractional input. This relates to the phenomenon commonly known as "wandering spurs". This phenomenon concerns the fact that at certain carrier frequencies, equivalently for certain values of the input x, one or more spurs move back and forth in the frequency spectrum, wandering to and from the carrier at a relatively low frequency.

Figure 5:
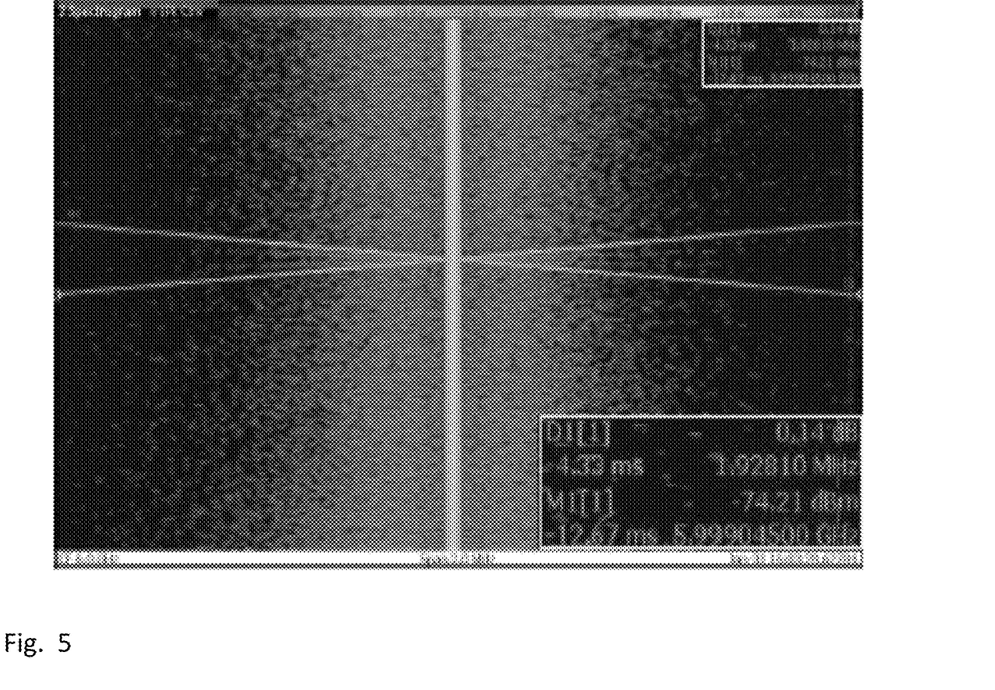
FIG. 5 is a spectrogram showing a typical manifestation of wandering spurs in the frequency domain in a fractional-N frequency synthesizer with a MASH 1-1-1 divider controller architecture.

FIG. 5 shows a typical manifestation of such wandering spurs in the frequency domain. The main spectral peak associated with the output frequency of the synthesizer appears as a straight line down the center of the spectrogram. The wandering tones form characteristic vee-shaped patterns to the left and right of the output frequency's main spectral peak.

The vee-shaped pattern to the left of the centerline corresponds to a wandering spur first increasing in frequency towards the output frequency and then reducing in frequency away from it. Similarly, the vee-shaped pattern to the right of the centerline corresponds to a wandering spur first decreasing in frequency towards the output frequency and then increasing in frequency away from it. The pattern is symmetrical about the centerline.

Figure 6:
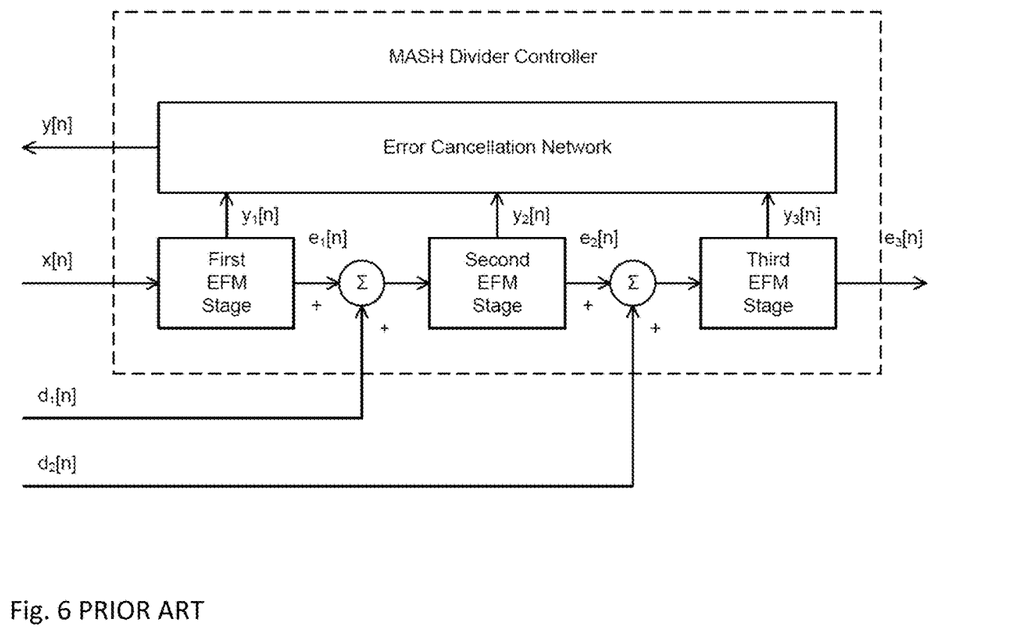
FIG. 6 shows a block diagram of a MASH 1-1-1 divider controller with first-order shaped dither and externally sourced additive high amplitude dither.

FIG. 6 shows a block diagram of one known architecture for reducing wandering spurs in a third-order MASH 1-1-1 divider controller. In this architecture, two dither inputs are provided. The first dither signal corresponds to a pseudorandom binary dither signal $d_1$ which is added to $e_1$ and the sum is applied as input to the second EFM stage, as is the case for the dither signal shown in FIG. 4. The second dither signal corresponds to an externally sourced high amplitude pseudorandom dither signal $d_2$ which is added to $e_2$ and the sum is applied as input to the third error feedback modulator stage.

Wandering spurs are caused by interaction between the accumulated error signal $e_{acc}$, and nonlinearity in the frequency synthesizer. $e_{acc}$ denotes the accumulated sum of the difference between the output y and the ratio x/M, i.e.

$$e_{acc}[n] = \sum_{k=0}^{n-1}(y[k]-x[k]/M),$$

where x and y are the input and output of the divider controller in FIG. 1 and M is the modulus of the divider controller.

Figure 7A:
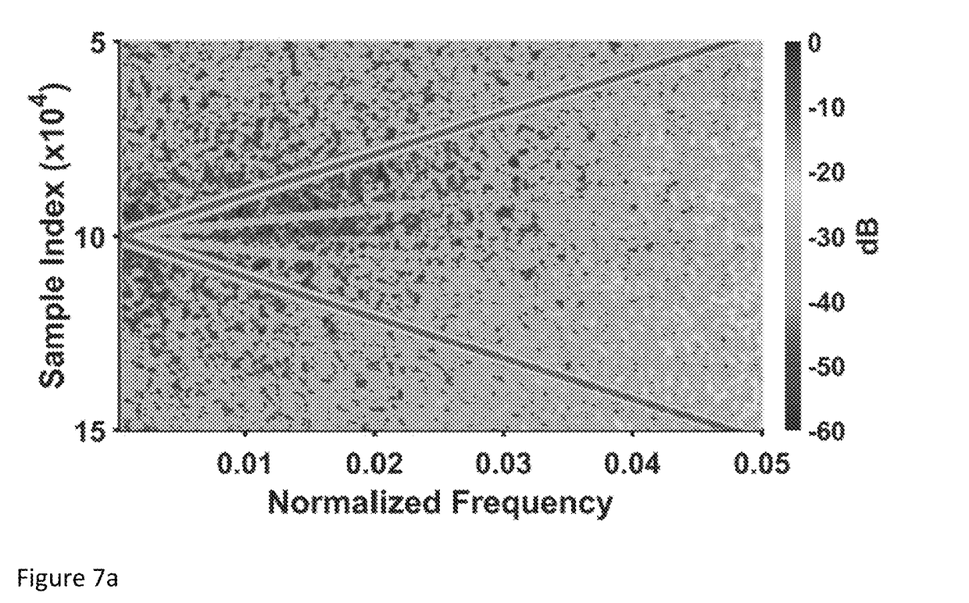
FIG. 7A shows simulated spectrograms of the distorted accumulated error of the MASH 1-1-1 divider controller of FIG. 4.

FIG. 7A shows the simulated spectrogram of $e_{acc}$ in respect of a frequency synthesizer with a DDSM comprising a first-order LSB dithered third-order Multi stAge noise SHaping (MASH) 1-1-1, such as that shown in FIG. 4, with first-order EFM stages, M=$2^{20}$ and x=1. The spectrogram in FIG. 7A exhibits the characteristic vee-shaped pattern which is associated with a manifestation of wandering spurs in the divider controller of FIG. 4.

Figure 7B:
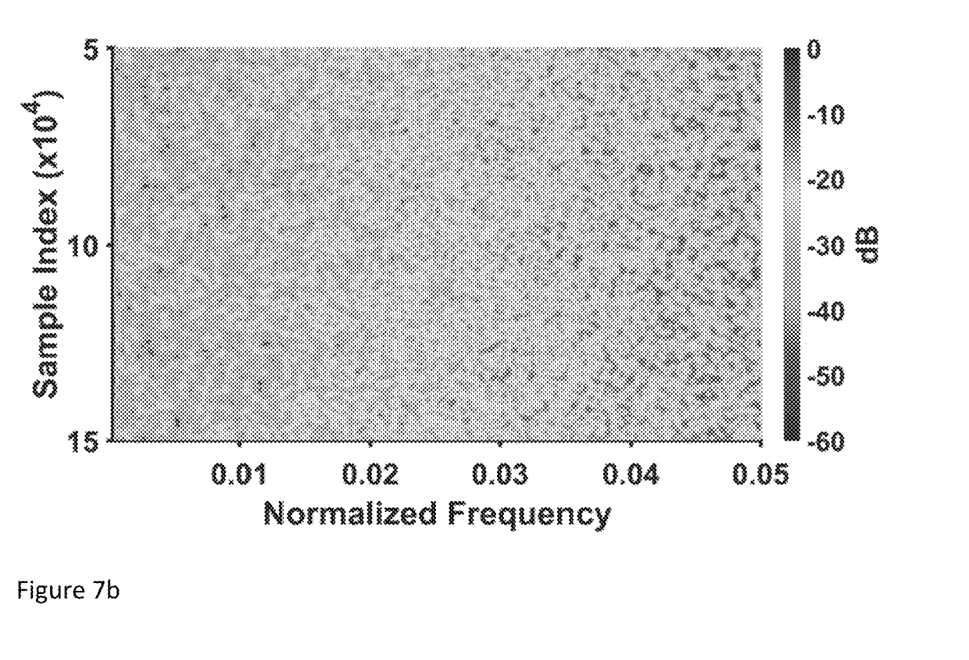
FIG. 7B shows simulated spectrograms of the distorted accumulated error of the MASH 1-1-1 divider controller with externally sourced additive high amplitude dither of FIG. 6.

FIG. 7B shows the simulated spectrogram of $e_{acc}$ in respect of a frequency synthesizer with a DDSM comprising a first-order LSB dithered third-order MASH 1-1-1 with an additional externally sourced additive high amplitude dither signal $d_2$, such as that shown in FIG. 6, with first-order EFM stages, M=$2^{20}$ and x=1, and where $d_2$ is a uniformly distributed integer in the range [0, M−1]. It can be seen that the high amplitude dither signal $d_2$ introduced in the architecture shown in FIG. 6 has reduced the wandering spur phenomenon to such an extent that no vee-shaped pattern is present in FIG. 7B. The wandering spur has been suppressed through the addition of the externally sourced high amplitude dither signal $d_2$.

Compared to the MASH 1-1-1 digital delta-sigma modulator in FIG. 4, additional hardware is required to generate the externally sourced high amplitude dither signal $d_2$ shown in FIG. 6. It would be advantageous to be able to mitigate wandering spurs without having to use additional hardware to generate such a high amplitude dither signal.

It will be appreciated that wandering spurs degrade the performance of the overall system in which the synthesizer is being used. This has been found to have a particular detrimental effect when the system is being used in applications such as communications, radar, and instrumentation.

SUMMARY OF THE EMBODIMENTS

Various embodiments of a fractional-N frequency synthesizer are disclosed. Broadly speaking, a fractional-N frequency synthesizer is disclosed, comprising a divider controller comprising a MultistAge noise SHaping (MASH) digital delta-sigma modulator comprising L Error Feedback Modulator (EFM) stages, wherein the jth EFM stage is configured to receive as an input the sum of the error of the preceding EFM stage and a high amplitude dither signal wherein the high amplitude dither signal comprises an integer dither signal derived from the error of the kth EFM stage, where 1≤j≤k≤L.

In one embodiment, the MASH digital delta-sigma modulator comprises a MASH digital delta-sigma modulator with additive first-order shaped dither.

In one embodiment, the MASH digital delta-sigma modulator comprises a MASH 1-1-1 architecture.

In one embodiment, each of the L EFM stages comprises a first-order error feedback modulator (EFM).

In one embodiment, the high amplitude dither signal is produced by filtering the error signal $e_k$ of the kth EFM stage with a transfer function DT(z), called the dither transfer function, where $D_2(z)=DT(z)E_k(z).$ In one embodiment, the dither transfer function DT(z) is a polynomial in $z^{-1}$ of the form $$DT(z) = \sum_{k=1}^{P} a_k z^{-k},$$

where each coefficient $a_k$ is a real number and P≥1 is an integer.

In another embodiment, a fractional-N frequency synthesizer is disclosed, comprising a divider controller comprising a MultistAge noise SHaping (MASH) digital delta-sigma modulator comprising L Error Feedback Modulator (EFM) stages, wherein the third EFM stage is configured to receive as an input the sum of the error of the second EFM stage and a high amplitude dither signal derived from the error of the kth EFM stage, where 3≤k≤L.

In yet another embodiment, a fractional-N frequency synthesizer is disclosed, comprising a divider controller comprising a MultistAge noise SHaping (MASH) digital delta-sigma modulator comprising L Error Feedback Modulator (EFM) stages, wherein the jth EFM stage is configured to receive as an input the sum of the error of the preceding EFM stage and a high amplitude dither signal derived from the error of the kth EFM stage, where 1≤j≤k≤L, wherein the high amplitude dither signal comprises a dither signal which is obtained by passing the error of the kth EFM stage through a filter block with a dither transfer function DT(z).

In one embodiment, the dither transfer function is $$DT(z) = \sum_{k=1}^{P} a_k z^{-k},$$

where each coefficient $a_k$ is a real number and P≥1 is an integer.

In one embodiment, the dither transfer function is $DT(z)=z^{-2}$.

In one embodiment, the dither transfer function is $DT(z)=-z^{-1}+2z^{-2}$.

In one embodiment, the dither transfer function is $DT(z)=-2z^{-1}+2z^{-2}$.

In one embodiment, the dither transfer function is $DT(z)=2z^{-2}-2z^{-3}$.

In one embodiment, the MASH digital delta-sigma modulator comprises a MASH digital delta-sigma modulator with additive first-order dither.

In one embodiment, the MASH digital delta-sigma modulator comprises a MASH 1-1-1 architecture.

In one embodiment, each of the L EFM stages comprises a first-order error feedback modulator (EFM).

In one embodiment, j=3.

In another embodiment, a fractional-N frequency synthesizer is disclosed, comprising a divider controller comprising a MultistAge noise SHaping (MASH) digital delta-sigma modulator comprising three Error Feedback Modulator (EFM) stages, wherein the third EFM stage is configured to receive as an input the sum of the error of the second EFM stage and a high amplitude dither signal derived from the error of the third EFM stage.

In yet another embodiment, a fractional-N frequency synthesizer is disclosed, comprising a divider controller comprising a MultistAge noise SHaping (MASH) digital delta-sigma modulator comprising a MASH 1-1-1 architecture with additive first-order dither comprising a first EFM stage, a second EFM stage and a third EFM stage, and wherein the third EFM stage of the MASH architecture is configured to receive as an input the sum of the error of the second EFM stage and a high amplitude dither signal derived from passing the error of the third EFM stage through a filter block.

In one embodiment, the high amplitude dither signal is filtered in accordance with the equation:

$$Y(z)=(1/M)*[X(z)+(1-z^{-1})D_1(z)-(1-z^{-1})^3E_3(z)+(1-z^{-1})^2D_2(z)],$$

where Y corresponds to the Z-transform of the output signal of the MASH 1-1-1 architecture; X corresponds to the Z-transform of the input signal to the MASH 1-1-1 architecture; $D_1$ corresponds to the Z-transform of the additive first-order dither signal; $E_3$ corresponds to the Z-transform of the error of the third EFM stage of the MASH 1-1-1 architecture; and $D_2$ corresponds to the Z-transform of the high amplitude dither signal.

In one embodiment, the high amplitude dither signal is filtered in accordance with the equation:

$$Y(z)=(1/M)*[X(z)+(1-z^{-1})D_1(z)-(1-z^{-1})^3E_3(z)+(1-z^{-1})^2DT(z)E_3(z)],$$

where Y corresponds to the Z-transform of the output signal of the MASH 1-1-1 architecture; X corresponds to the Z-transform of the input signal to the MASH 1-1-1 architecture; $D_1$ corresponds to the Z-transform of the additive first-order dither signal; $E_3$ corresponds to the Z-transform of the error of the third EFM stage of the MASH 1-1-1 architecture; and the dither transfer function DT(z) corresponds to the transfer function of the filter block.

In one embodiment, the dither transfer function is $$DT(z) = \sum_{k=1}^{P} a_k z^{-k},$$

where each coefficient $a_k$ is a real number and $P \geq 1$ is an integer.

In one embodiment, the dither transfer function is $DT(z)=z^{-2}$.

In one embodiment, the dither transfer function is $DT(z)=-z^{-1}+2z^{-2}$.

In one embodiment, the dither transfer function is $DT(z)=-2z^{-1}+2z^{-2}$.

In one embodiment, the dither transfer function is $DT(z)=2z^{-2}-2z^{-3}$.

In one embodiment, the second EFM stage of the MASH architecture is configured to receive as an input the sum of the error of the first EFM stage and a binary dither signal.

In one embodiment, each of the L EFM stages comprises a first-order error feedback modulator (EFM).

BRIEF DESCRIPTION OF THE DRAWINGS

The present disclosure will be more clearly understood from the following description of an embodiment thereof, given by way of example only, with reference to the accompanying drawings, in which:—

DETAILED DESCRIPTION

The present disclosure provides a fractional-N frequency synthesizer which reduces the effect of wandering spurs exhibited by the synthesizer when operating with a higher resolution DDSM-based divider controller. The present disclosure will now be described in conjunction with FIG. 8 onwards.

Wandering spurs are caused by interaction between the signal injected by a DDSM-based divider controller and a synthesizer's phase-locked loop.

Figure 8:
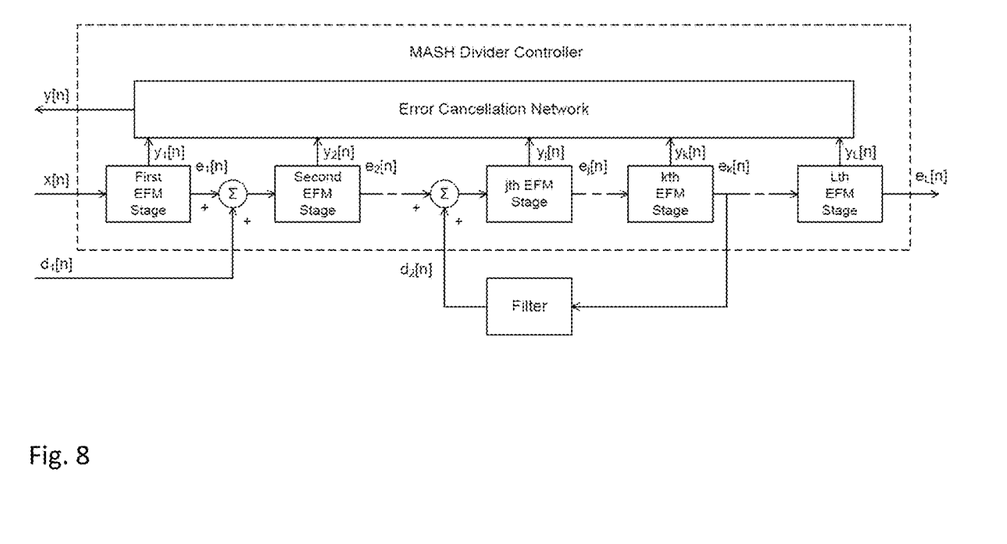
FIG. 8 shows a block diagram of an embodiment of a high amplitude dithered MASH divider controller in accordance with the present disclosure, where the high amplitude dither signal is derived from the error of the kth EFM stage and is added to the input of the jth EFM stage.

FIG. 8 shows one embodiment of the present disclosure where the DDSM incorporated into the synthesizer comprises a modified MASH divider controller. The MASH divider controller comprises a cascade of L number of first-order Error Feedback Modulators (EFM). The MASH is known to suffer from limit cycles. Therefore, a binary dither signal, denoted $d_1$, is added to $e_1$ and the sum is applied as input to the second EFM stage to mitigate limit cycle behavior. The MASH divider controller is further modified by adding a high-amplitude dither to the input of the jth EFM stage of the MASH architecture, where j≥1. The high amplitude dither signal is produced by passing the error signal from the kth EFM stage through a filter with transfer function DT(z), where j≤k≤L.

Figure 9:
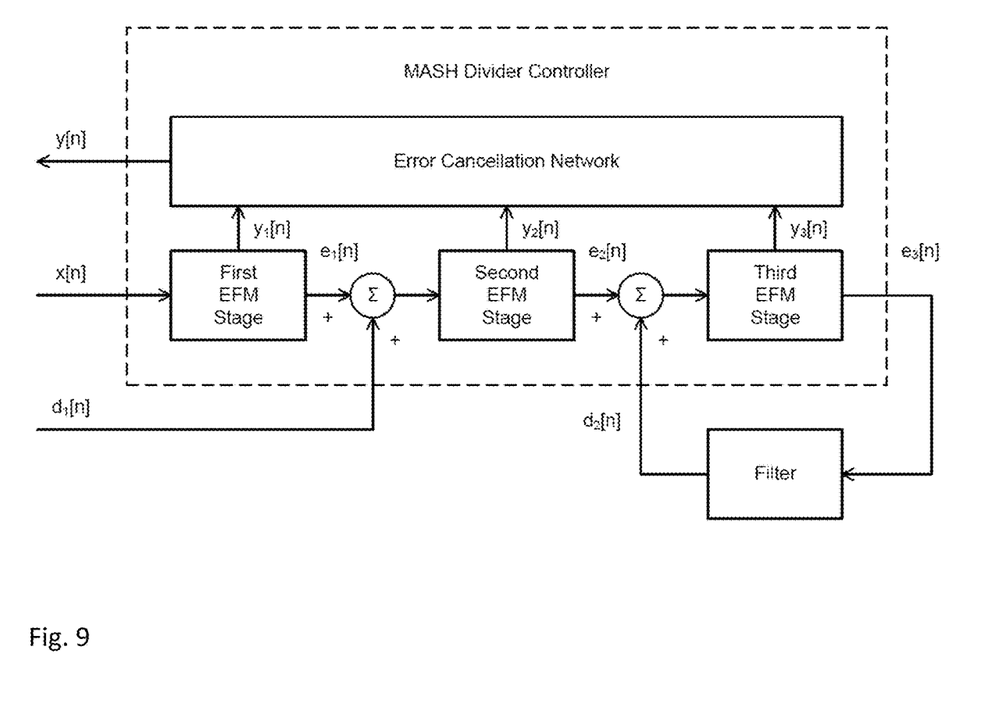
FIG. 9 shows a block diagram of an embodiment of a high amplitude dithered MASH 1-1-1 divider controller in accordance with the present disclosure, where the high amplitude dither signal is derived from the error of the third EFM stage.

FIG. 9 shows one embodiment of the present disclosure where the DDSM incorporated into the synthesizer comprises a modified MASH 1-1-1 divider controller. The MASH 1-1-1 divider controller comprises a cascade of three first-order Error Feedback Modulators (EFM). Firstly, a binary dither signal, denoted $d_1$, is added to $e_1$ and the sum is applied as input to the second EFM stage to mitigate limit cycle behavior.

The MASH 1-1-1 divider controller is further modified by adding a high-amplitude dither to the input of the third EFM stage of the MASH architecture.

The dither signal $d_2$ is obtained by passing the error of the third EFM stage $e_3$ through a filter block with a dither transfer function DT(z), as shown in FIG. 9, where j=3, k=3, and $$D_2(z)=DT(z)E_3(z).$$

In one embodiment, the dither transfer function is DT(z) is a polynomial in $z^{-1}$ of the form $$DT(z) = \sum_{k=1}^{P} a_k z^{-k},$$

where each coefficient $a_k$ is a real number and P≥1 is an integer.

This dither signal is second-order high pass filtered when it appears at the output. In the z domain, $$Y(z) = (1/M)^*\left[X(z)+(1-z^{-1})D_1(z)-(1-z^{-1})^3 E_3(z)+(1-z^{-1})^2 D_2(z)\right]$$
$$= (1/M)^*\left[X(z)+(1-z^{-1})D_1(z)-(1-z^{-1})^3 E_3(z)+(1-z^{-1})^2 DT(z)E_3(z)\right]$$
$$= (1/M)^*\left[X(z)+(1-z^{-1})D_1(z)+(1-z^{-1})^2(-1+z^{-1}+DT(z))E_3(z)\right],$$

where Y, X, $D_1$, $D_2$ and $E_3$ are the Z-transforms of y, x, the dither signals $d_1$ and $d_2$, and the error of the third EFM stage, and DT(z) is the transfer function of the filter block in FIG. 9.

The dither transfer function can be chosen to shape the additional noise introduced by adding $DT(z)E_3(z)$ to $e_2$ and applying the sum as input to the third EFM stage.

In a first embodiment, the dither transfer function is $DT(z)=z^{-2}$.

In a second embodiment, the dither transfer function is $DT(z)=-z^{-1}+2z^{-2}$.

In a third embodiment, the dither transfer function is $DT(z)=-2z^{-1}+2z^{-2}$.

In a fourth embodiment, the dither transfer function is $DT(z)=2z^{-2}-2z^{-3}$.

When $DT(z)=z^{-2}$ and $DT(z)=-z^{-1}+2z^{-2}$, the additional noise is second-order shaped. When $DT(z)=-2z^{-1}+2z^{-2}$ and $DT(z)=2z^{-2}-2z^{-3}$ the additional noise is third-order shaped. Choosing coefficients $a_k$ of the dither transfer function that are positive or negative powers of two simplifies the realization of DT(z) in hardware.

The wandering spur phenomenon is caused by a chirp signal that is produced at the input to the VCO. This chirp has its origin in the DDSM. By adding high amplitude dither to the input of the jth EFM stage of the MASH divider controller where j≥1, it swamps the chirp signal and eliminates the wandering spur.

Figure 10A:
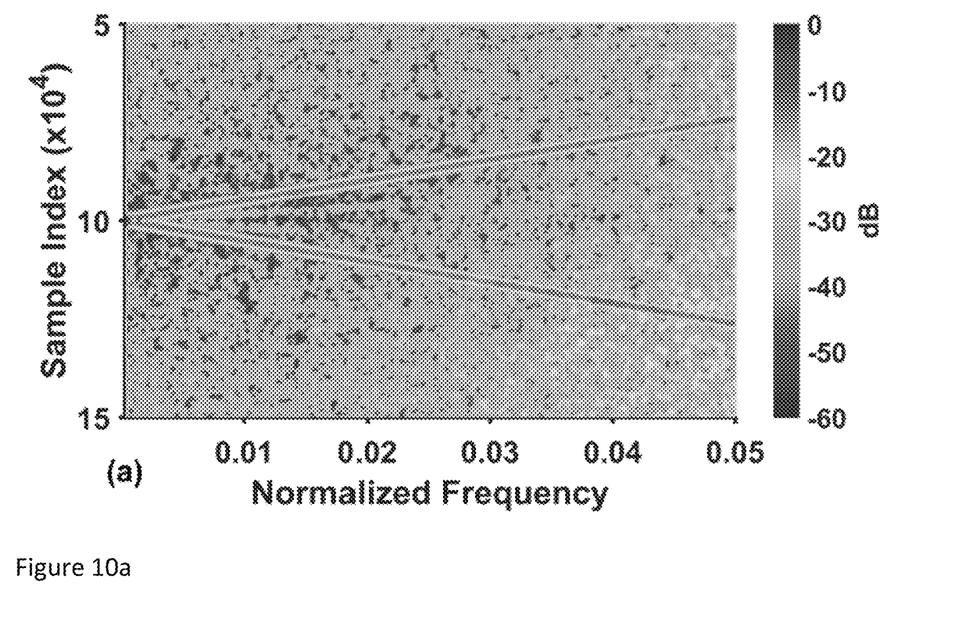
FIG. 10A shows simulated spectrograms of the distorted accumulated error signal of the MASH 1-1-1 divider controller of FIG. 4.
Figure 10B:
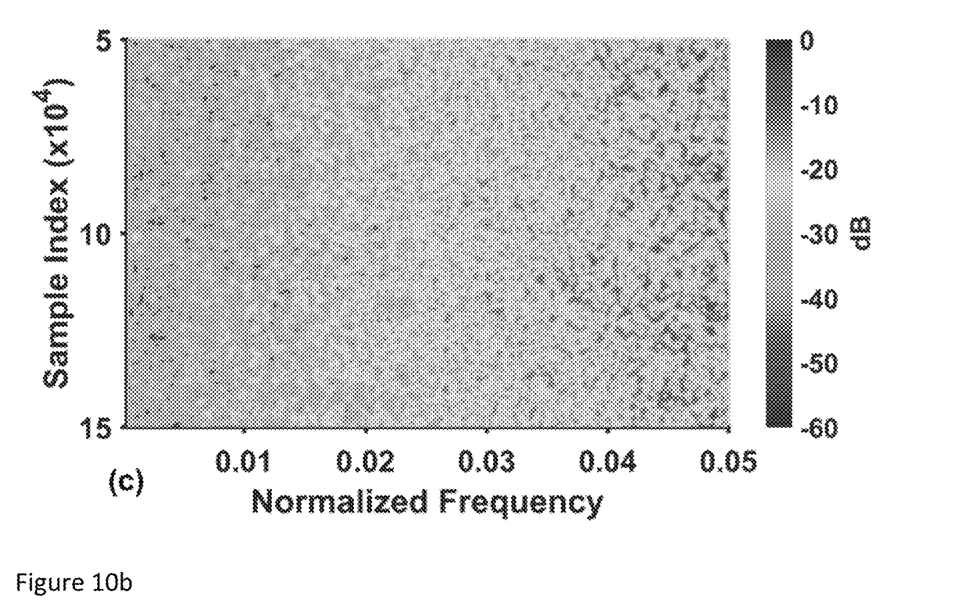
FIG. 10B shows simulated spectrograms of the distorted accumulated error signal of a first embodiment of a high amplitude dithered MASH 1-1-1 divider controller in accordance with the present disclosure.

FIG. 10A shows simulated spectrograms of the distorted accumulated error signal of the MASH 1-1-1 divider controller of FIG. 4 and FIG. 10B shows simulated spectrograms of the distorted accumulated error signal of the high amplitude dithered MASH 1-1-1 divider controller of FIG. 9 for the first embodiment of the dither transfer function where $DT(z)=z^{-2}$ after passing through a piecewise-linear nonlinearity with 8% mismatch (x=2 and $M=2^{20}$). By comparison with FIG. 10A, it can be seen from FIG. 10B that the addition of the dither signal $D_2(z)=z^{-2}E_3(z)$ results in the elimination of wandering spurs in the spectrogram of the distorted signal.

Figure 11A:
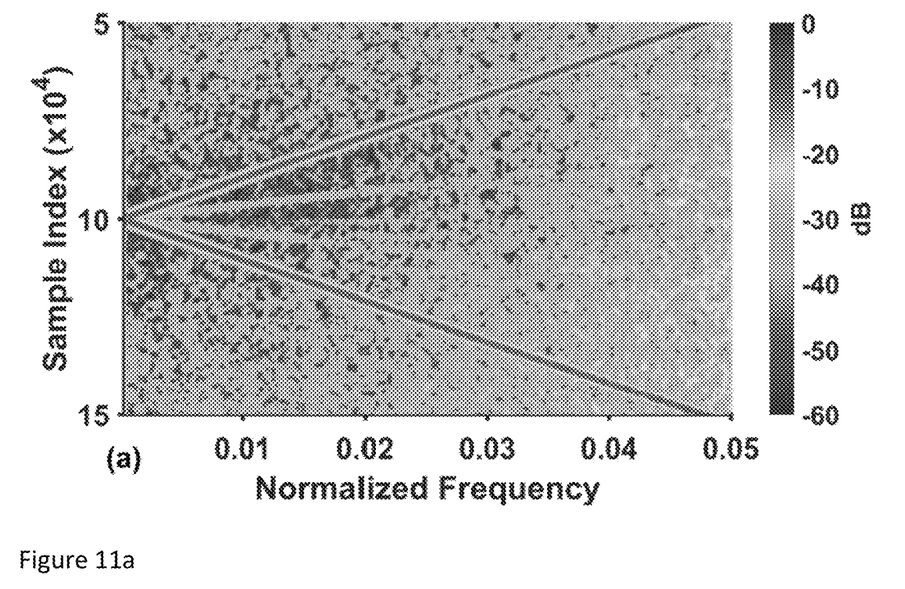
FIG. 11A shows simulated spectrograms of the distorted accumulated error signal of the MASH 1-1-1 divider controller of FIG. 4.
Figure 11B:
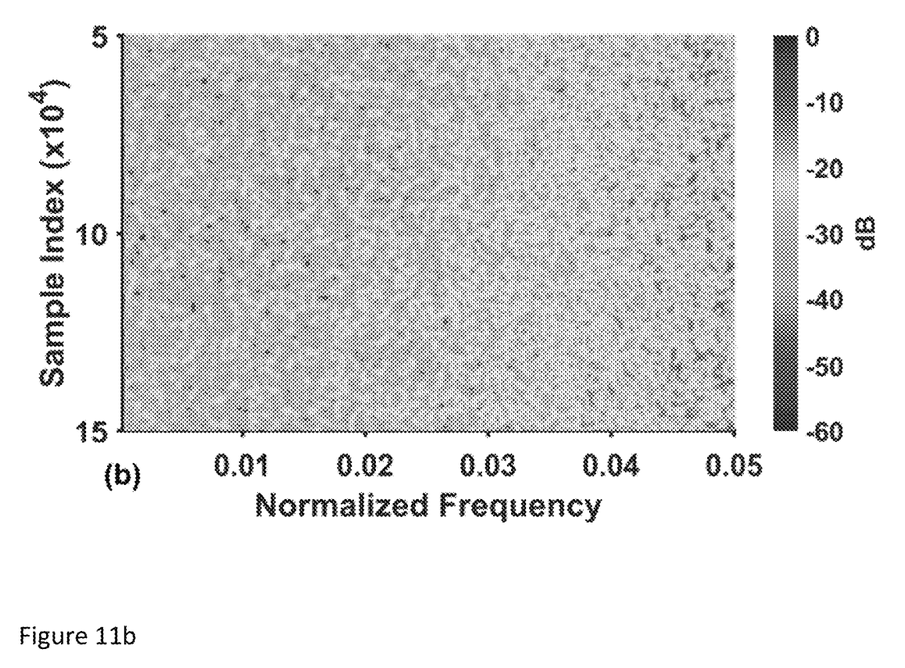
FIG. 11B shows simulated spectrograms of the distorted accumulated error signal of a third embodiment of a high amplitude dithered MASH 1-1-1 divider controller in accordance with the present disclosure.

FIG. 11A shows simulated spectrograms of the distorted accumulated error signal of the MASH 1-1-1 divider controller of FIG. 4 and FIG. 11B shows simulated spectrograms of the distorted accumulated error signal of the high amplitude dithered MASH 1-1-1 divider controller of FIG. 9 for the third embodiment of the dither transfer function where $DT(z)=-2z^{-1}(1-z^{-1})$ after passing through a piecewise-linear nonlinearity with 8% mismatch (x=1 and $M=2^{20}$). By comparison with FIG. 11A, it can be seen from FIG. 11B that the addition of the dither signal $D_2(z)=-2z^{-1}(1-z^{-1})E_3(z)$ results in the elimination of wandering spurs in the spectrogram of the distorted signal.

Figure 12A:
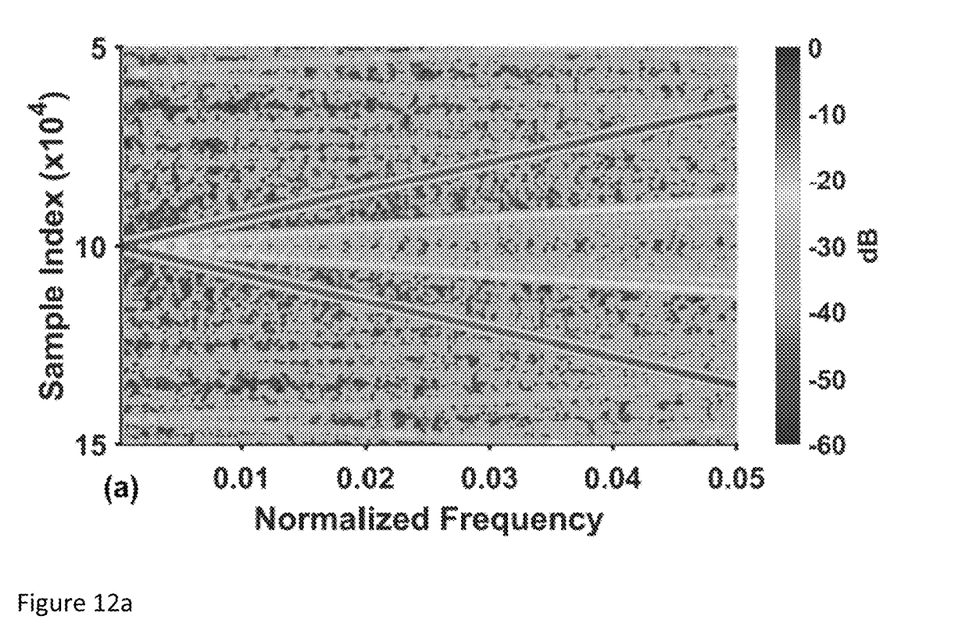
FIG. 12A shows simulated spectrograms of the distorted accumulated error signal of the MASH 1-1-1 divider controller of FIG. 4.
Figure 12B:
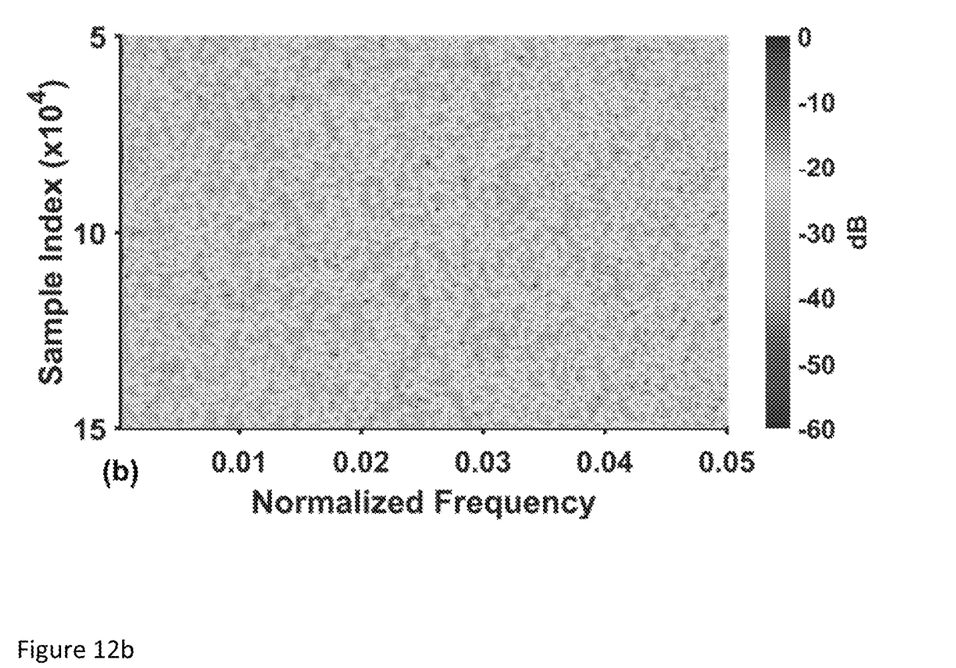
FIG. 12B shows simulated spectrograms of the distorted accumulated error signal of a fourth embodiment of a high amplitude dithered MASH 1-1-1 divider controller in accordance with the present disclosure.

FIG. 12A shows simulated spectrograms of the distorted accumulated error signal of the MASH 1-1-1 divider controller of FIG. 4 and FIG. 12B shows simulated spectrograms of the distorted accumulated error signal of the high amplitude dithered MASH 1-1-1 divider controller of FIG. 9 for the fourth embodiment of the dither transfer function where with $DT(z)=2z^{-2}(1-z^{-1})$ after passing through a piecewise-linear nonlinearity with 8% mismatch ($M=2^{20}$ and x=M/2). By comparison with FIG. 12A, it can be seen from FIG. 12B that the addition of the dither signal $D_2(z)=2z^{-2}(1-z^{-1})E_3(z)$ results in the elimination of wandering spurs in the spectrogram of the distorted signal.

Figure 13A:
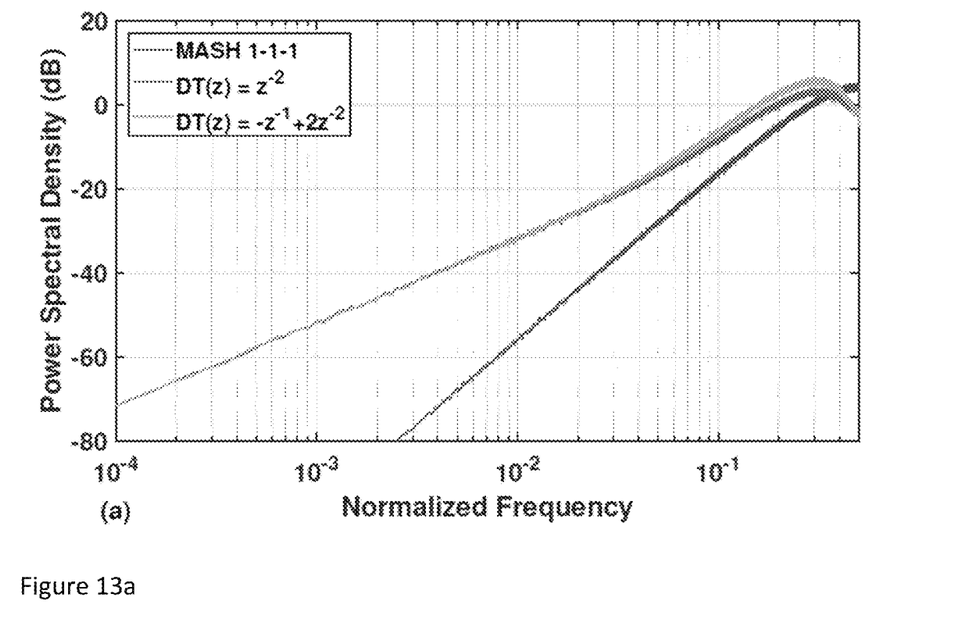
FIG. 13A shows simulated spectra of the accumulated error signal for the MASH 1-1-1 divider controller of FIG. 4 and two described embodiments of the high amplitude dithered divider controller of the present disclosure with second-order noise shaping.
Figure 13B:
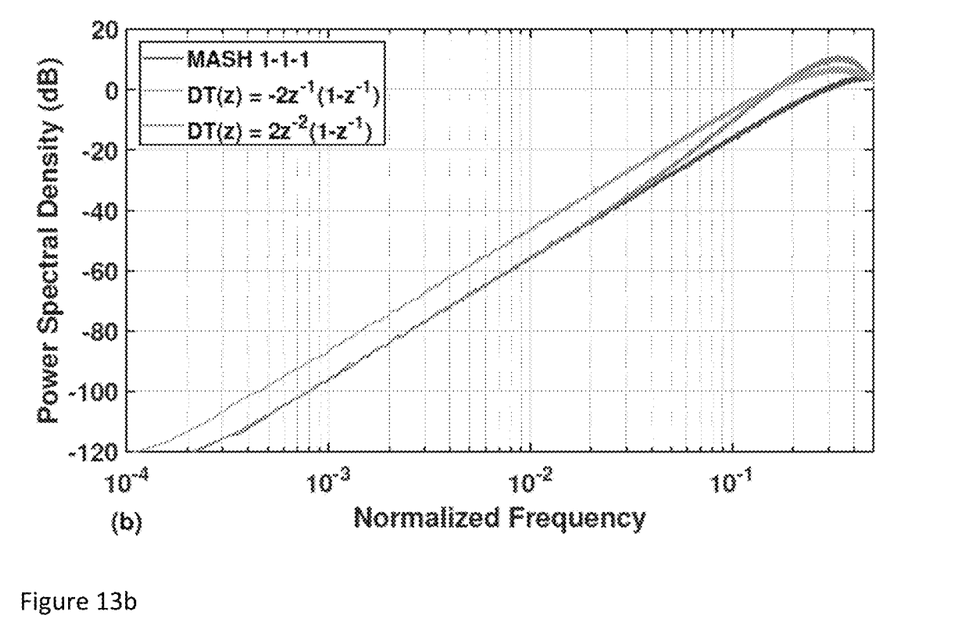
FIG. 13B shows simulated spectra of the accumulated error signal for the MASH 1-1-1 divider controller of FIG. 4 and two described embodiments of the high amplitude dithered divider controller of the present disclosure with third-order noise shaping.

The addition of a high amplitude dither signal $d_2$ increases the spectral envelope of the noise introduced into a frequency synthesizer by the DDSM. FIG. 13A shows spectra for the MASH 1-1-1 of FIG. 4 and the high amplitude dithered divider controller of the present disclosure of FIG. 9 for the first embodiment where $DT(z)=z^{-2}$ and for the second embodiment where $DT(z)=-z^{-1}+2z^{-2}$. FIG. 13B shows spectra for the MASH 1-1-1 of FIG. 4 and the high amplitude dithered divider controller of the present disclosure of FIG. 9 for the third embodiment where $DT(z)=-2z^{-1}(1-z^{-1})$, and for the fourth embodiment where $DT(z)=2z^{-2}(1-z^{-1})$.

When incorporated in a frequency synthesizer with non-linear distortion, the modified MASH 1-1-1 divider controller does not exhibit wandering spurs. Furthermore, the dither signal $d_2$ is produced by scaling and combining current and past samples of the error signal using a filter with transfer function $DT(z)$. This obviates the need for an additional random signal source to provide the dither signal $d_2$ and thus represents a saving in hardware and power.

Thus, it will be appreciated that the fractional-N frequency synthesizer of the present disclosure provides a divider controller signal which is less prone to produce wandering spurs than a frequency synthesizer that uses a conventional dithered digital delta-sigma modulator. Through the mitigation of wandering spurs, it enables the frequency synthesizer to generate cleaner carriers for a range of applications including communications, radar and instrumentation.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The present disclosure is not limited to the embodiments hereinbefore described but may be varied in both construction and detail.

The invention claimed is:

1. A fractional-N frequency synthesizer comprising a divider controller comprising a multistage noise shaping (MASH) digital delta-sigma modulator comprising L Error Feedback Modulator (EFM) stages, wherein a jth EFM stage is configured to receive as an input a sum of an error of a preceding EFM stage and a high amplitude dither signal, wherein the high amplitude dither signal comprises an integer dither signal derived from an error of a kth EFM stage, where 1≤j≤k≤L.

2. The fractional-N frequency synthesizer of claim 1, wherein the MASH digital delta-sigma modulator comprises a MASH digital delta-sigma modulator with additive first-order shaped dither.

3. The fractional-N frequency synthesizer of claim 1, wherein the MASH digital delta-sigma modulator comprises a MASH 1-1-1 architecture.

4. The fractional-N frequency synthesizer of claim 1, wherein each of the L EFM stages comprises a first-order error feedback modulator (EFM).

5. A fractional-N frequency synthesizer comprising a divider controller comprising a multistage noise Shaping (MASH) digital delta-sigma modulator comprising L Error Feedback Modulator (EFM) stages, wherein a jth EFM stage is configured to receive as an input a sum of an error of a preceding EFM stage and a high amplitude dither signal derived from an error of a kth EFM stage, where 1≤j≤k≤L, wherein the high amplitude dither signal comprises a dither signal which is obtained by passing the error of the kth EFM stage through a filter block with a dither transfer function $DT(z)$.

6. The fractional-N frequency synthesizer of claim 5, wherein the dither transfer function is $DT(z)=z^{-2}$.

7. The fractional-N frequency synthesizer of claim 5, wherein the dither transfer function is $DT(z)=-z^{-1}+2z^{-2}$.

8. The fractional-N frequency synthesizer of claim 5, wherein the dither transfer function is $DT(z)=-2z^{-1}+2z^{-2}$.

9. The fractional-N frequency synthesizer of claim 5, wherein the dither transfer function is $DT(z)=2z^{-2}-2z^{-3}$.

10. The fractional-N frequency synthesizer of claim 5, wherein the MASH digital delta-sigma modulator comprises a MASH digital delta-sigma modulator with additive first-order dither.

11. The fractional-N frequency synthesizer of claim 5, wherein the MASH digital delta-sigma modulator comprises a MASH 1-1-1 architecture, and wherein each of the L EFM stages comprises a first-order error feedback modulator (EFM).

12. The fractional-N frequency synthesizer of claim 5, wherein j=3.

13. A fractional-N frequency synthesizer comprising a divider controller comprising a multistage noise Shaping (MASH) digital delta-sigma modulator comprising a MASH 1-1-1 architecture with additive first-order dither comprising a first EFM stage, a second EFM stage and a third EFM stage, and
   wherein the third EFM stage of the MASH architecture is configured to receive as an input a sum of an error of the second EFM stage and a high amplitude dither signal derived from passing an error of the third EFM stage through a filter block.

14. The fractional-N frequency synthesizer of claim 13, wherein the high amplitude dither signal is filtered in accordance with the equation:

$$Y(z)=(1/M)*[X(z)+(1-z^{-1})D_1(z)+(1-z^{-1})^3E_3(z)+(1-z^{-1})^2DT(z)E_3(z)]$$

where Y corresponds to a Z-transform of an output signal of the MASH 1-1-1 architecture; X corresponds to the Z-transform of an input signal to the MASH 1-1-1 architecture; $D_1$ corresponds to the Z-transform of an additive first-order dither signal; $DT(z)$ corresponds to a dither transfer function of the filter block; and $E_3$ corresponds to the Z-transform of the error of the third EFM stage of the MASH 1-1-1 architecture.

15. The fractional-N frequency synthesizer of claim 14, wherein the dither transfer function is $DT(z)=z^{-2}$.

16. The fractional-N frequency synthesizer of claim 14, wherein the dither transfer function is $DT(z)=-z^{-1}+2z^{-2}$.

17. The fractional-N frequency synthesizer of claim 14, wherein the dither transfer function is $DT(z)=-2z^{-1}+2z^{-2}$.

18. The fractional-N frequency synthesizer of claim 14, wherein the dither transfer function is $DT(z)=2z^{-2}-2z^{-3}$.

19. The fractional-N frequency synthesizer of claim 13, wherein the second EFM stage of the MASH 1-1-1 architecture is configured to receive as an input a sum of an error of the first EFM stage and a binary dither signal.

20. The fractional-N frequency synthesizer of claim 13, wherein each EFM stage comprises a first-order error feedback modulator (EFM).

* * * * *